United States Patent [19]

Bergemont

[11] Patent Number: 4,926,223
[45] Date of Patent: May 15, 1990

[54] DYNAMIC MEMORY OF THE INTEGRATED CIRCUIT TYPE

[75] Inventor: Albert Bergemont, Trets, France

[73] Assignee: SGS-Thomson Microelectronics S.A., Gentilly, France

[21] Appl. No.: 403,792

[22] Filed: Sep. 6, 1989

Related U.S. Application Data

[63] Continuation of Ser. No. 193,207, May 9, 1988, abandoned, which is a continuation of Ser. No. 827,730, Feb. 10, 1986, abandoned.

[30] Foreign Application Priority Data

Feb. 12, 1985 [FR] France ................. 85 01975

[51] Int. Cl.$^5$ .................. H01L 29/78; H01L 27/02; H01L 29/04
[52] U.S. Cl. ........................... 357/23.6; 357/41; 357/49; 357/51; 357/59
[58] Field of Search ............ 357/23.6, 59 G, 715, 357/67 S, 41, 51, 49

[56] References Cited

U.S. PATENT DOCUMENTS

| | | |
|---|---|---|
| 4,151,607 | 4/1979 | Koyanagi et al. |
| 4,329,706 | 5/1982 | Crowder et al. ............ 357/715 |
| 4,355,374 | 10/1982 | Sakai et al. |
| 4,641,166 | 2/1987 | Takemae et al. ........... 357/23.6 |
| 4,649,406 | 3/1987 | Takemae et al. ........... 357/23.6 |

FOREIGN PATENT DOCUMENTS

| | | |
|---|---|---|
| 0112670 | 4/1984 | European Pat. Off. |
| 2489579 | 8/1981 | France. |
| 60-37766 | 2/1985 | Japan ...................... 357/23.6 |

OTHER PUBLICATIONS

IEEE Journal of Solid State Circuits, vol. SC-16, No. 5, Oct. 1981, pp. 499-505, New York, U.S.; Hu H. Chao et al., "A 34 μm$^2$ DRAM Cell Fabricated with a 1 μm Single-Level Polycide FET Technology", *FIG. 3*.

Primary Examiner—Andrew J. James
Assistant Examiner—Ngan Van Ngo
Attorney, Agent, or Firm—Oblon, Spivak, McClelland, Maier & Neustadt

[57] ABSTRACT

In a dynamic memory for capacitive data storage, enhanced data storage and transfer performances are achieved on the one hand by increasing the value of storage capacitance and on the other hand by increasing the conductivity of the transfer lines. The word lines of the memory cells are metallized in order to increase the speed of propagation of reading and/or writing instructions. Metallization of the word lines makes it possible to cover the memory cell with a second polysilicon layer followed by a third polysilicon layer in order to increase the data-storage capacity.

8 Claims, 5 Drawing Sheets

DYNAMIC MEMORY OF THE INTEGRATED CIRCUIT TYPE

This application is a continuation of application Ser. No. 07/193,207, filed on May 9, 1988, now abandoned, which is a continuation of application Ser. No. 06/827,730, filed on Feb. 10, 1986, now abandoned.

BACKGROUND OF THE INVENTION

1. Field of the Invention

The present invention relates to a dynamic memory of the integrated circuit type.

2. Description of the Prior Art

The memories under consideration in this invention are based on the principle of capacitive data storage. In a memory of this type, a memory cell comprises a transistor in which the gate is connected to a so-called word line and in which the two main electrodes are connected on the one hand to a data storage capacitor and on the other hand to a data transfer line or so-called bit line. The transfer line serves either to read data written in the memory cell or to write data. For the reading operation, the memory cell transistor receives a pulse on its gate via the word line, whereupon said transistor is turned-on, the capacitor is discharged and the information contained therein is collected by the bit line. For the writing operation, the reverse operation takes place. Thus an item of information to be recorded is present on the bit line, the transistor gate receives a pulse via its word line, the transistor is turned-on and the capacitor is charged. Moreover, since the reading operation is destructive (destructive readout), this step is usually followed by re-writing of data in the memory cell.

The capacitors of each memory cell are formed by opposition of two conducting layers separated by an insulating layer. In order to increase the capacitance of the memory cells, it has been proposed to spread the capacitance. This technique, however, is subject to a limitation in regard t increase in integration density. In fact, if the number of memory cells per unit area increases, the value of capacitance assigned to each cell and attained in this manner will be reduced accordingly. Instead of spreading the capacitance over the top face of the memory cell, it has even been proposed to cut trenches around the memory cell and to form capacitors by opposition of conductive layers applied on the walls and between the walls of these trenches. However, this technique cannot readily be carried out in actual practice. Its effectiveness increases as the trenches are cut to a greater depth but this in turn gives rise to greater difficulties.

At the time of utilization of the memory, the speed at which reading or writing orders can be executed depends on the speed at which the word lines are capable of transmitting pulses to the transistors concerned. In order to satisfy requirements of simplification of the fabrication process, the word lines coincide with the gate electrodes of the transistors and consist of silicon strips separated from the conduction channels of the transistors by a thin gate oxide layer. The silicon of these connecting leads is never perfectly conductive and the word lines are therefore resistive. Since they are also capacitive by virtue of their environment, said word lines induce the presence of propagation time constants. These time constants impose a limitation on the speed of execution of reading and writing operations. In order to overcome this additional drawback, one expedient which has been considered in the prior art consists in adding, above and opposite to each word line, a metallic line which follows this latter, which has very low resistance and which connects the silicon gate at uniform intervals. The memory cells thus receive the reading or writing orders at higher speeds than would have been the case if these orders had emanated from the gate lead itself. The disadvantage of this arrangement is that it entails the need to provide lines at the top of the memory for repeating the word lines. As in all other operations in a fabrication process, this additional operation makes a further contribution to a reduction in efficiency of production of memories.

SUMMARY OF THE INVENTION

The invention makes it possible to overcome the above-mentioned disadvantages by proposing a dynamic memory in which the memory cells are provided with a capacitance which extends over practically the entire memory surface. In accordance with another feature of the invention, the word line is metallized, thus removing the need for an additional top line.

The invention relates to a dynamic memory of the integrated circuit type fabricated in a silicon wafer and provided with memory cells for capacitive data storage, the dynamic memory being distinguished by the fact that it comprises :

transistors fabricated in the CMOS technology for utilization as memory cells and provided with gate electrodes formed by a first level of deposited polysilicon and covered by a metallized layer to be utilized as a word line for the memory ;
means for capacitive storage by putting in opposition, at a second and a third level, two polysilicon layers separated from each other and from the first level by insulating layers of silicon oxide ;
data transfer lines formed of vacuum-deposited metal ; the polysilicon layers of the second and third levels being formed so as to pass over the polysilicon layer of the first level.

BRIEF DESCRIPTION OF THE DRAWINGS

Other features of the invention will be more apparent upon consideration of the following description and accompanying drawings in which the same references designate the same elements, and in which.

DESCRIPTION OF THE PREFERRED EMBODIMENTS

Figure 1:
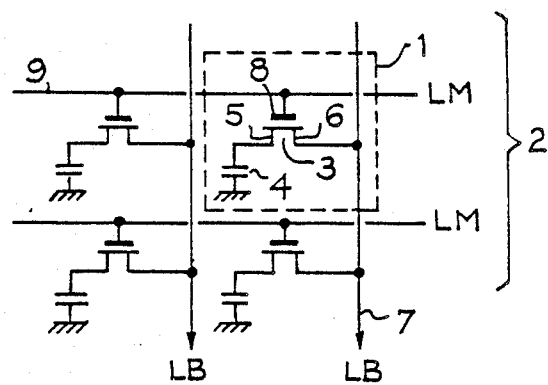
FIG. 1 illustrates an array of memory cells of a dynamic memory in accordance with the invention.

FIG. 1 illustrates a memory cell 1 of a dynamic memory 2. Said memory cell comprises a transistor 3 and a capacitor 4. The source 5 of the transistor is connected to the capacitor 4 whilst the drain 6 of said transistor is connected to a data transfer lead 7 or so-called bit line. The gate 8 of the transistor 3 is connected to a lead 9 designated as a word line. The present invention is not concerned with the management aspect of the memory. Of primary interest here is the need to increase the value of the capacitor 4 so that this latter should have a high value with respect to the capacitance of the transfer line 7. One conductor or "plate" of the capacitor 4 is connected to the source 5 of the transistor 3 whilst the other capacitor conductor or "plate" is connected to a constant potential which is represented schematically as ground. In point of fact, the important requirement to be satisfied is that the potential on the second capacitor plate is constant with respect to the electric charge to be stored in said capacitor.

Figure 2:
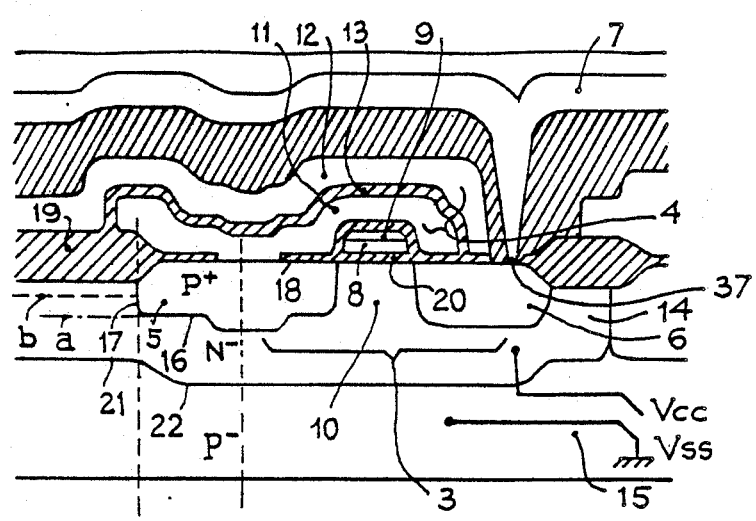
FIG. 2 illustrates the technological structure of a memory cell in accordance with the invention.

FIG. 2 is a sectional view of a memory cell which is of the same type as the cell shown in FIG. 1 and is also endowed with the properties of the present invention. This memory cell comprises in particular a transistor 3 provided with its source 5 and with its drain 6. A conduction channel 10 is controlled by the gate 8 of the transistor. Said gate 8 also represents a word line 9. The capacitor 4 has two conductive layers 11 and 12 separated by an oxide layer 13 which partly cover the memory cell transistor. The layer 11 is connected to the source 5 whilst the layer 12 is common to a number of capacitors and even to all the capacitors of the memory. Said layer 12 is connected to a constant potential (not shown in the diagrams). The transistor 3 is placed within a well 14 contained in a semiconductor substrate 15 consisting of silicon in one example and very lightly doped. Also by way of example, the substrate has p-type conductivity, an approximate resistivity of three ohms-cm and a crystal orientation of $<100>$. The well 14 is of n-type conductivity and has a medium impurity concentration. In one example, this concentration in the vicinity of the source and drain regions 5 and 6 of the transistor is of the order of $10^{17}$ atoms of phosphorus per cubic centimeter. This concentration is comparable with the well concentrations which are commonly employed in the CMOS technology and which are on the whole of the order of $10^{16}$ atoms per cm$^3$. The substrate 15 is biased at a potential $\underline{V}_{ss}$ whilst the well of the transistor 3 is biased at a potential $V_{cc}$. In one example, $V_{ss}$ represents ground and $V_{cc}$ has a value of about 5 volts. The bias thus applied has the effect of reversing the well-substrate junction.

The well N is of small depth and effectively reduces the sensitivity of the memory cell to alpha particles. The alpha particles produced by the ceramic module which contains the memory induce the creation of electron-hole pairs in the wells or in the substrates. If precautionary measures are not taken, minority carriers are liable to discharge the capacitors which contain the information by migration to the sources of the transistors. It is for this reason that the well-substrate junction is reversed. Thus its potential barrier is such that the minority carriers (in this case holes in the n-type well) created by the pairs are attracted by the bottom of the substrate which is in close proximity and connected to ground. These minority carriers consequently do not discharge the capacitors. This result is obtained more effectively as the well is of smaller depth. From this point of view, the structure of memory cells in accordance with the CMOS technology is therefore superior to the structure produced by the NMOS technology (in which there is no well). In the second place, the wells are also capable of reducing sensitivity to substrate currents. These currents also have the effect of inducing information losses in the memory cells. In fact, since the memory cell transistors operate in the saturating mode at the moment of data transfer, there is a potential danger of impact ionization which would give rise to creations of pairs. Holes thus created may be applied to capacitors of adjacent memory cells. The quantity of information contained in these adjacent memory cells is in that case altered. The potential barrier of the well 14 serves to prevent any return of these charges.

The conventional capacitor 4 is increased by the $P+ - N-$ junction capacitance existing between the source 5 and the well 14. The value of this capacitance is determined by the area of the deserted region of said source-well junction. This area is inversely proportional to the impurity concentration of the least heavily doped side of the junction. In this case the least heavily doped side is the well side. In fact, with commonly accepted orders of magnitude, the impurity concentration of sources and drains of the memory cell transistors is of the order of $10^{19}$ to $10^{20}$ atoms per cm$^3$. The existence of junction capacitors is turned to profitable account by making the source-well junction capacitance comparable with that of the conventional capacitor 4. By increasing the impurity concentration of the well 14 (n-type doping), the junction capacitance is increased on the one hand by means of the bottom 16 of the junction and on the other hand by means of the periphery 17 of said junction. In this case, the impurity concentration of the well 14 is different according to whether the location considered is in the vicinity of the bottom portion 16 of a source region 5, that is to say substantially at a height level a with respect to the level 18 of the gate oxide or at a height level b at the periphery 17 of said region.

Figure 3:
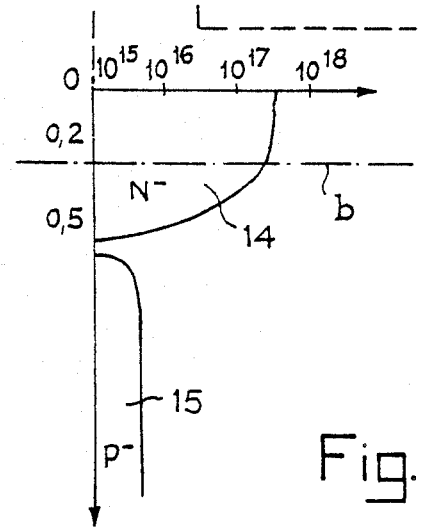
FIGS. 3 and 4 are diagrams of impurity concentrations in different regions of the memory cell in accordance with the invention.
Figure 4:
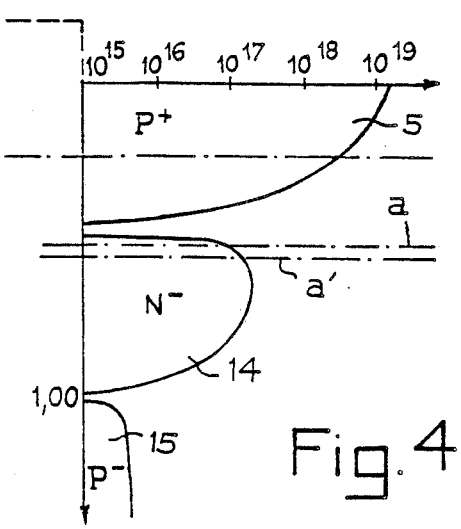

FIGS. 3 and 4 indicate impurity concentration profiles within the well, respectively at the immediate periphery 17 of the source 5 and opposite to the center of the source region 5. In the vicinity of the periphery 17, the memory cell transistor is bordered at the top by a thick oxide region 19. Identification depths are expressed in micrometers and show that the thickness of the well 14 is only of the order of one micrometer beneath the active regions. This thickness has a value of approximately 0.5 micrometer beneath the thick oxide layer 19. In one example, the thick oxide layer 19 has a thickness of the order of 0.4 micrometer. The concentration profile directly beneath this thick oxide layer is maintained from the interface between well 14 and thick oxide 19 to the level b at approximately $5 \times 10^{17}$ atoms of phosphorus per cm$^3$. In one example, the height b has a value of slightly more than 0.2 micrometer. On the other hand, it is noted from FIG. 4 that the bottom of the source region 5 (corresponding to the height level a) is located in regions in which the n-type concentration is below the value given above. In one example, the concentration at these locations is of the order of 5 to $8 \times 10^{16}$. The deserted region of the source-substrate junction at the level a is therefore of greater thickness than at the periphery 17. In consequence, the junction capacitance at the periphery 17 is higher than the bottom capacitance 16. This particular effect is put to use in the present invention for the purpose of increasing the value of the conventional storage capacitor 4. The peripheral capacitor becomes comparable with the capacitor 4 and even of higher value.

The concentration profiles shown in FIGS. 3 and 4 represent a departure from customary practice. In the first place, the value of concentrations is higher than usual. In the CMOS technology, the formation of wells having a high concentration minimizes troublesome phenomena of triggering of parasitic thyristors. In this technology, a well of opposite conductivity with respect to the conductivity of the substrate contains transistors having reverse channel polarity. There may therefore exist "geographically" a succession of npnp-type or pnpn-type doped regions. If no precautions are taken, a thyristor effect may be initiated. The need to reduce this probability in turn makes it necessary to form wells having a high impurity concentration. As a general rule, however, impurity concentrations within the wells must be limited to a few $10^{16}$ atoms per $cm^3$ in order to allow the possibility of adjustment of the threshold voltage of the transistors. A further point is that the shape of the concentration profile is a matter of importance in the case under consideration. In all fabrication processes, junction wells are in fact doped prior to formation of the other regions of the integrated circuit. The concentrations established at different levels within the wells accordingly have a tendency to spread by diffusion in a uniform manner throughout the well. This diffusion results from all the successive thermal operations subsequently carried out on the integrated circuit. In the present invention, the concentrations are not uniformly distributed but are limited to a predetermined maximum level. The $p^-$type doping which corresponds to the substrate 15 can be observed in FIGS. 3 and 4. In FIG. 4, the source 5 has a much higher concentration in proximity to the gate oxide surface 20. This concentration is of the order of $10^{19}$ atoms of boron per $cm^3$ and is wholly normal.

FIGS. 5a to 5i show the different steps of the method of fabrication of the memory cell hereinabove described. These steps make it possible to attain the concentrations which are shown in FIGS. 3 and 4 and the technical effects of which have been explained earlier. In an initial stage, the description which now follows will be concerned with the operations which take place during a fabrication process without giving any consideration to the configuration of the different regions. These regions will subsequently be described with reference to FIGS. 6a to 6g. For the sake of simplicity of the explanation, it will be assumed that suitable masks are applied during the process for the purpose of defining specific portions of the memory cells under construction.

In this process, the well impurities are implanted after formation of the thick oxide regions 19. It is possible by implantation to impose the formation of concentration peaks at the desired height (b) and at the desired value ($10^{17}$). In other words, implantation of wells is performed backwards, that is, partly through the separating thick oxides. The pre-existence of these thick oxides prevents subsequent diffusion of the implanted impurities towards said thick oxides. The concentration peak is maintained at the chosen height and value in spite of the annealing operation to which the wafer is later subjected. In the case considered, this is due to the coefficient of segregation of phosphorus at the well/thick oxide interface. The backward implantation is apparent in FIG. 2 : the bottom of the well 14 exhibits a change in level or stepped portion 21-22 between the portions located respectively beneath the thick oxide regions 19 and beneath the active regions which are intended to receive the transistors 3.

Figure 5:
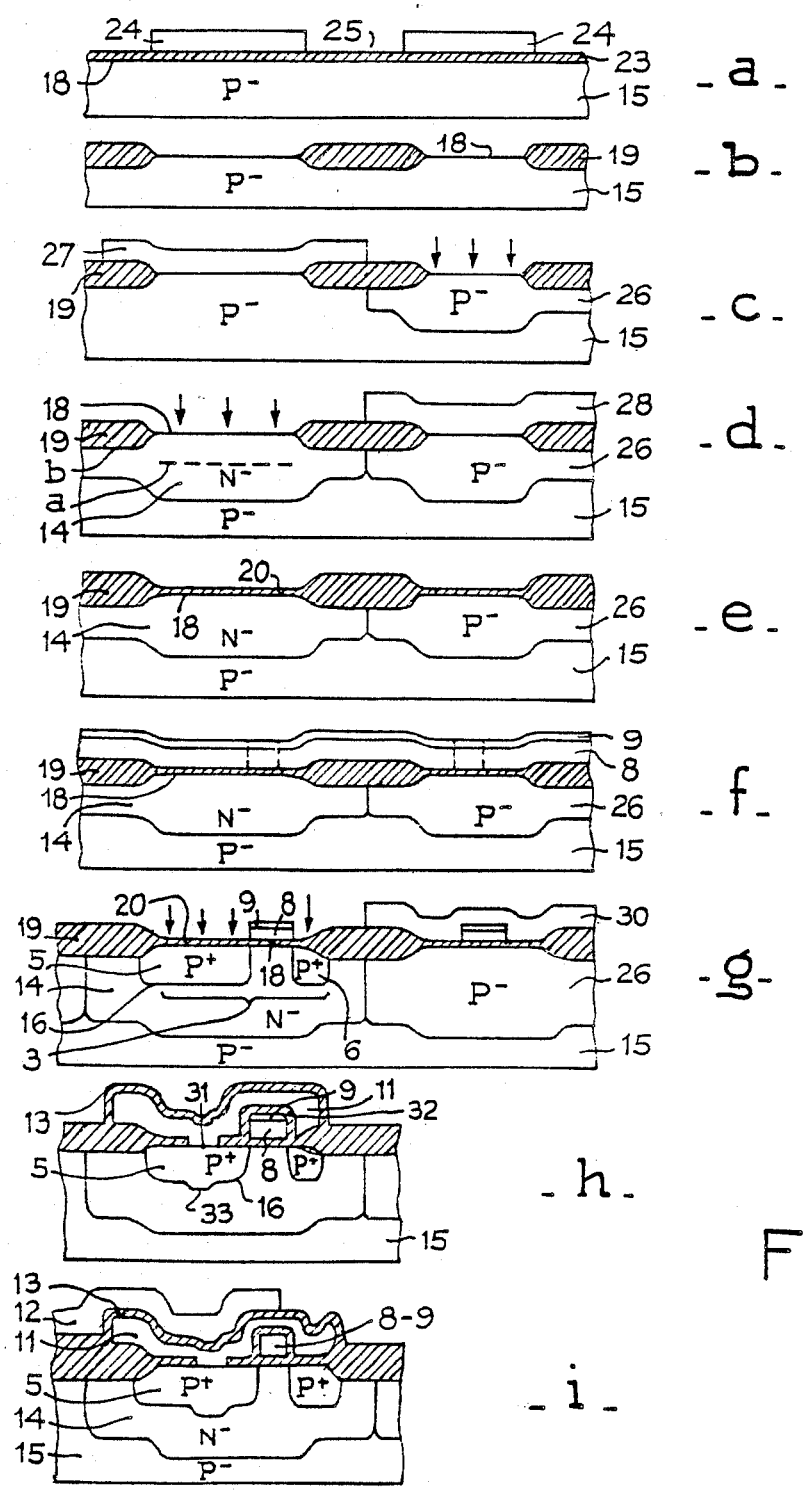
FIGS. 5a to 5i illustrate characteristic steps of the method of fabrication of the memory cell in accordance with the invention.

FIG. 5a shows a semiconductor substrate 15 consisting, for example, of lightly p-doped silicon. The substrate has been covered by growth of a thin-film layer 23 of silicon oxide followed by deposition of a silicon nitride layer 24. By means of a first mask, the layer 24 is then defined by photolithography and etching of the silicon nitride. The layer 23 prevents the layer 24 from inducing destructive mechanical forces within the substrate 15 during growth of the insulating oxide 19. The first mask thus serves to delimit the active regions and the regions in which the separating thick oxides will be formed between memory cells (regions 25). An insulating oxide layer is then grown to a thickness of 4000 angstroms, for example. The nitride layer 24 serves as an oxidation barrier. The initial oxide 23 and the nitride 24 are then dissolved (FIG. 5b) and a second photomasking operation is then performed so as to define a $p^-$type well 26.

FIG. 5c shows a resin layer 27 which protects certain regions of the wafer. This resin layer is applied during the second photomasking operation by means of a second mask. The justification for the formation of the $p^-$type wells lies in the fact that the invention is proposed here in a CMOS technology. Whereas all the memory cells of a wafer are formed in a single well (well 14), peripheral circuits and memory cell management circuits can be fabricated in the complementary MOS technology. It is therefore important in this description to indicate the method adopted for forming the wells which contain the control circuits of the memory. The wells 26 are in fact false wells consisting of $p^-$type wells in a $p^-$type substrate and only their concentration profile makes it possible to distinguish them from the substrate. The implantation represented by three vertical arrows is obtained by electron bombardment of boron atoms having two energies : a first deep bombardment at 300 KeV and a second surface bombardment of lower power which serves to adjust the threshold of the n-channel transistors implanted into the wells 26.

A third photomasking operation then defines the n-type wells as shown in FIG. 5d. A resin layer 28 is then deposited with a view to protecting the regions of the previously implanted wells. Implantation of the n-type well or wells involves a double electron bombardment of phosphorus atoms. A first deep implantation of phosphorus at 500 KeV results in the formation of an n-type well having a depth substantially equal to 1 micrometer beneath the active regions and to 0.5 micrometer beneath the thick oxide. The concentration peak attains a few $10^{17}$ atoms per $cm^3$ at the height level b directly above the thick oxide layer as well as at the height level a directly above the active portions. A second implantation of phosphorus at approximately 100 KeV then makes it possible to adjust the surface concentration to a few $10^{16}$ atoms per $cm^3$. The concentration profiles thus obtained are shown in FIGS. 3 and 4. A third implantation but this time of boron atoms and at low energy can permit counter-doping of the well at the surface in order to obtain a good threshold of conduction of the p-channel transistors. A gate oxide 20 having a thickness in the vicinity of 250 to 300 angstroms is then formed. This step corresponds to FIG. 5e and is conventional, the oxide being obtained by the thermal growth technique.

FIG. 5f partly shows the operation involved in construction of the gates. For the gates, a first layer 8 of polysilicon is deposited and doped (for example with PoCL$_3$) by means of standard techniques. An important feature of the invention accordingly consists in forming a metallization 9. Thus a layer 9 of tungsten silicides (WSi$_2$ or WSi$_3$) is deposited above said first level 8 of polysilicon. The gates are then defined and etched by means of a fourth mask and during a fourth photomasking operation. The gates serve as a word line in the memory plane. These gates are suggested by dashed lines in FIG. 5f. The thickness of the gate layer of polysilicon is approximately 4000 angstroms and the thickness of the tungsten silicide layer is approximately 1500 angstroms in one example.

All the transistor gates having thus been defined, a fifth photomasking operation is carried out (as shown in FIG. 5g). This operation consists in protecting by means of a resin layer 30 the peripheral portions of the memory in which it is not desired to implant p-channel transistors such as those of the memory cells. These transistors are implanted by low-energy but high-density bombardment of boron impurities. The sources 5 and drains 6 of the transistors 3 of the memory cells are thus formed. This implantation is self-aligned on the one hand with the thick oxide regions 19 and on the other hand with the polysilicon/tungsten silicide layer of the gates. Implantation of the drain and source regions is performed in such a manner as to ensure that the bottom 16 of these regions is approximately at a location in which the well has the highest n-type impurity concentration. In one example, the depth of the bottom portion 16 is approximately 5000 angstroms. It is worthy of note that this implantation has not passed through the thick oxide layer 19 which has a value of only 4000 angstroms by reason of the fact that the implantation is carried out at low energy.

FIG. 5h shows an opening 31 formed on the source side of the transistor. This opening is formed after the entire memory plane has been covered by thermal growth of a silicon oxide layer 32. Said opening is obtained by means of a sixth photomasking operation and by means of a sixth mask. A second polysilicon layer 11 is then deposited at a second level over the entire surface of the memory plane and doped with boron. The layer 11 is doped with boron in order to avoid the creation of an electronic junction between said layer and the source 5 (which is also effectively doped with boron at the location of the opening 31). As a result of doping of the layer 11, a stepped portion 33 located beneath the level 16 is formed at the bottom face 16 of the source directly beneath the opening 31. It will be noted from FIG. 4 that said stepped portion has the effect of transferring the deserted region from the level a to the lower level a' and therefore towards regions in which the impurity concentration of the well 14 progressively rises. At the level a', the concentration within the well 14 is higher and the junction capacitance is favorably increased as a result. Doping can consequently be a means for adjusting the junction capacitance. In one example, the thickness of the layer 11 is of the order of 3000 angstroms.

A seventh photomasking operation is then performed by means of a seventh mask in order to define and etch the regions of the memory plane in which it is desired to form the capacitor plates 11. An important feature of the invention lies in the fact that the conductive layer or plate 11 partially covers the memory cell even at the gate location, thereby increasing the value of the capacitance 4. The deposited layer 11 is then oxidized to a thickness within the approximate range of 300 to 400 angstroms. The thickness of the oxide layer 13 thus obtained is intended to serve as a dielectric between the two plates of the conventional memory cell capacitor. FIG. 5i includes the second plate 12 of the conventional memory cell capacitor. As in the case of the first plate, this second plate is formed by chemical deposition of silicon in the gas phase. This is a third level of silicon deposition. The second plate or layer 12 is then defined and etched by means of an eighth mask and finally covered by thermal growth of a silicon oxide layer. The thickness of the layer 12 is of the same order as that of the layer 11. The third polysilicon level can be doped with boron or phosphorus according to choice.

The data-transfer leads 7 of deposited aluminum are formed with a ninth and a tenth photomasking operation. The ninth operation serves to form an opening 37 (shown in FIG. 2) in the drain 6 of the transistor. The tenth operation serves to define the bit lines 7. A number of additional operations are also performed but are not distinctive features of the invention.

Figure 6:
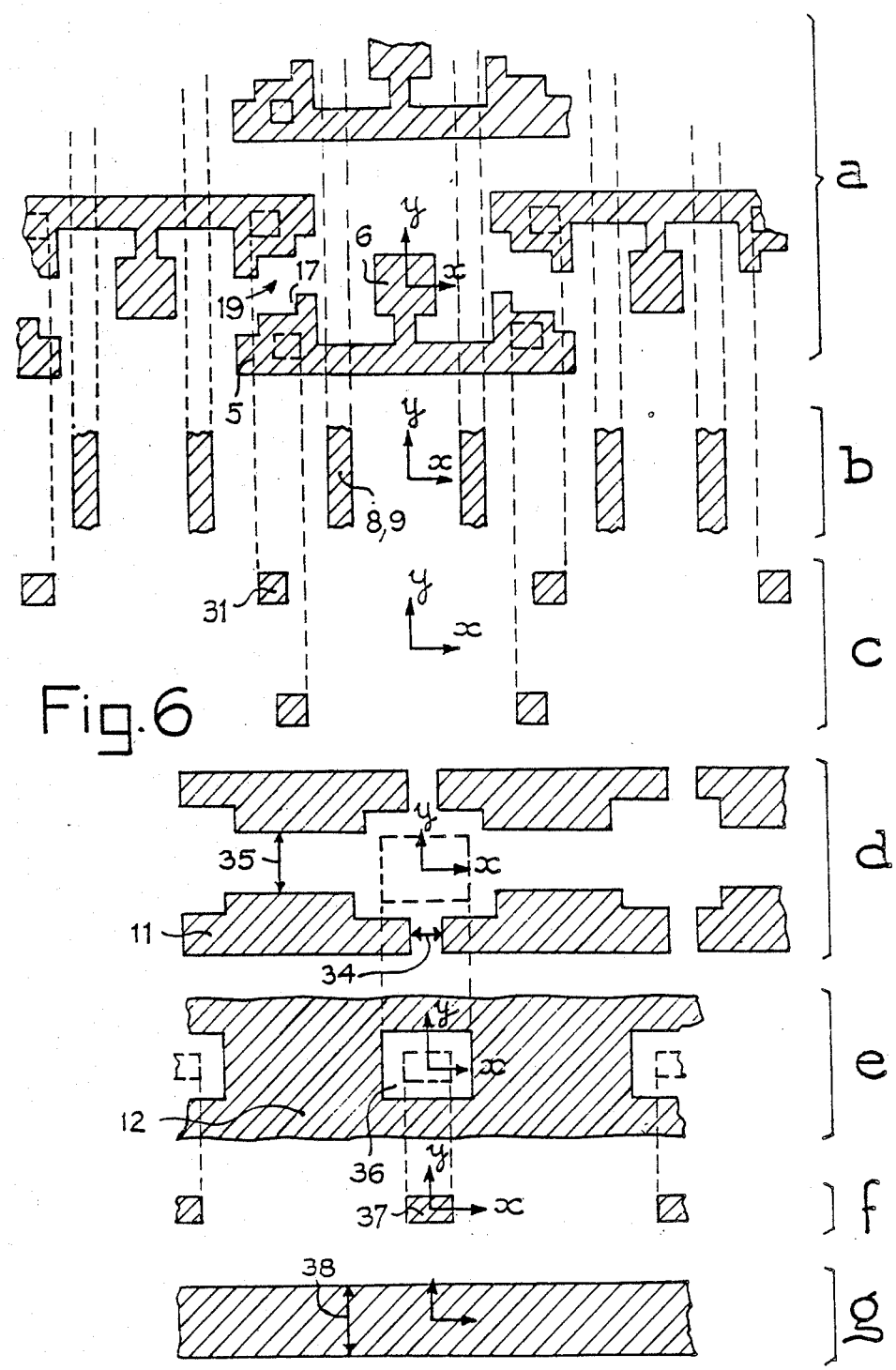
FIGS. 6a to 6g illustrate the complete set of successive masks employed for defining the geometry of the memory cell in accordance with the invention.

FIGS. 6a to 6q illustrate designs of some of the masks employed for defining the different memory plane regions. In order to gain a better understanding of the superposed arrangement of these masks, each mask is provided with a locating reference x y which is intended to be aligned on a reference of the memory plane during use. All these masks have opaque portions, scored portions and transparent portions which are adjacent to the opaque portions. The first mask employed in the initial photomasking operation is illustrated in FIG. 6a. This figure gives a general idea of the pattern repetitivity of the memory cells. This mask serves to define the thick oxide regions 19 which separate the memory cells and are transparent portions. The unitary pattern of this mask has the general shape of a T. This unitary pattern in fact corresponds to two adjacent memory cells connected to one and the same data-transfer line and to two adjacent word lines. These cells as shown by way of example in FIG. 1 are the memory cell 1 and the cell located directly beneath.

A castellated outline 17 can be seen to the left of the axis y at the point corresponding to the reference. Since the well of the memory plane is implanted everywhere, this outline in fact corresponds on the one hand to the thick oxide boundary and on the other hand to the periphery of the source region 5. The reason for which the outline is castellated lies in the need to increase the peripheral length of the source region. This has the effect of increasing the storage capacity. In fact, as a result of implantation of the source and drain regions, the thermal annealing operations bring the source regions 5 against the highly concentrated portions of the n-type well (beneath the thick oxide).

One of the characteristics of the invention lies in the fact that it permits easy juxtaposition of the drain regions 6 of two adjacent memory cells. With a view to reducing the capacitance of the data-transfer line (bit line), it is endeavored to reduce the length of the contour of the region 6. In fact, since the peripheral capacitance of the source regions has been increased, the peripheral capacitance of the drain region 6 is also increased. The result thereby achieved is that the capacitance of the data-transfer line is also increased. In point of fact, the capacitance of the data-transfer line is substantially higher than the storage capacitance and is ten times greater, for example. While doubling the storage capacitance by means of the invention (roughly speaking, its value increases from one unit to two units), the capacitance of the transfer line is also increased by approximately one unit and accordingly has a value of eleven units. Proportionally, the improvement is therefore equivalent to slightly less than 100 %. This result is in fact closely related to the height of the concentration peak at the height level b of the well 14. It is only necessary to increase this latter in order to adjust the capacitance to the desired value. It will be noted, however, that the fact of juxtaposing two drains 6 of two adjacent memory cells has the effect of dividing the periphery of the common drain by two.

In the alternative embodiment illustrated in FIGS. 7a to 7g and 8, the general objective is the same. The bit line capacitance is minimized by reducing the dimensions of the drains 6. The drain regions are now limited to lateral regions 61, 62 with respect to the conduction channel regions. In the alternative embodiment, the drain regions of two geographically adjacent memory cells no longer coincide but are divided into two separate regions. It will be seen below that these two drains are none the less electrically connected by means of a polysilicon layer 41 deposited at the same time as the layer 11 (but at different locations). As will readily be apparent, the solution proposed in the alternative embodiment also makes it possible to reduce the contour of the drain regions. These regions are limited by the contour of the end portions 61 and 62.

The second and third masks employed during the second and third photomasking operations are not illustrated in the drawings but are complementary to each other. In a conventional configuration in which the memory cells are distributed at the center of a memory plane and in which the management elements are distributed over the periphery of said plane, the second mask protects the portion corresponding to the memory cells and the third mask protects the peripheral portion of the management circuits. In the alternative embodiment and at the time of the fourth photomasking operation which takes place after formation of the metallized gates, the fourth mask shown in FIGS. 6b and 7b serves to define and to etch the gate connections. The location at which the fourth mask is superposed is represented by dashed lines in FIGS. 6a and 7a. It is only after creation of the word lines 8–9 that effective implantation of the sources 5 and drains 6 of the memory cells is achieved. The fifth mask is not shown in the drawings. Apart from the peripheral regions of the memory, the entire memory plane receives the source and drain implantations of the cells. Implantation of the n-channel transistors contained in these peripheral regions is conventional and will therefore not be discussed here.

Figure 7:
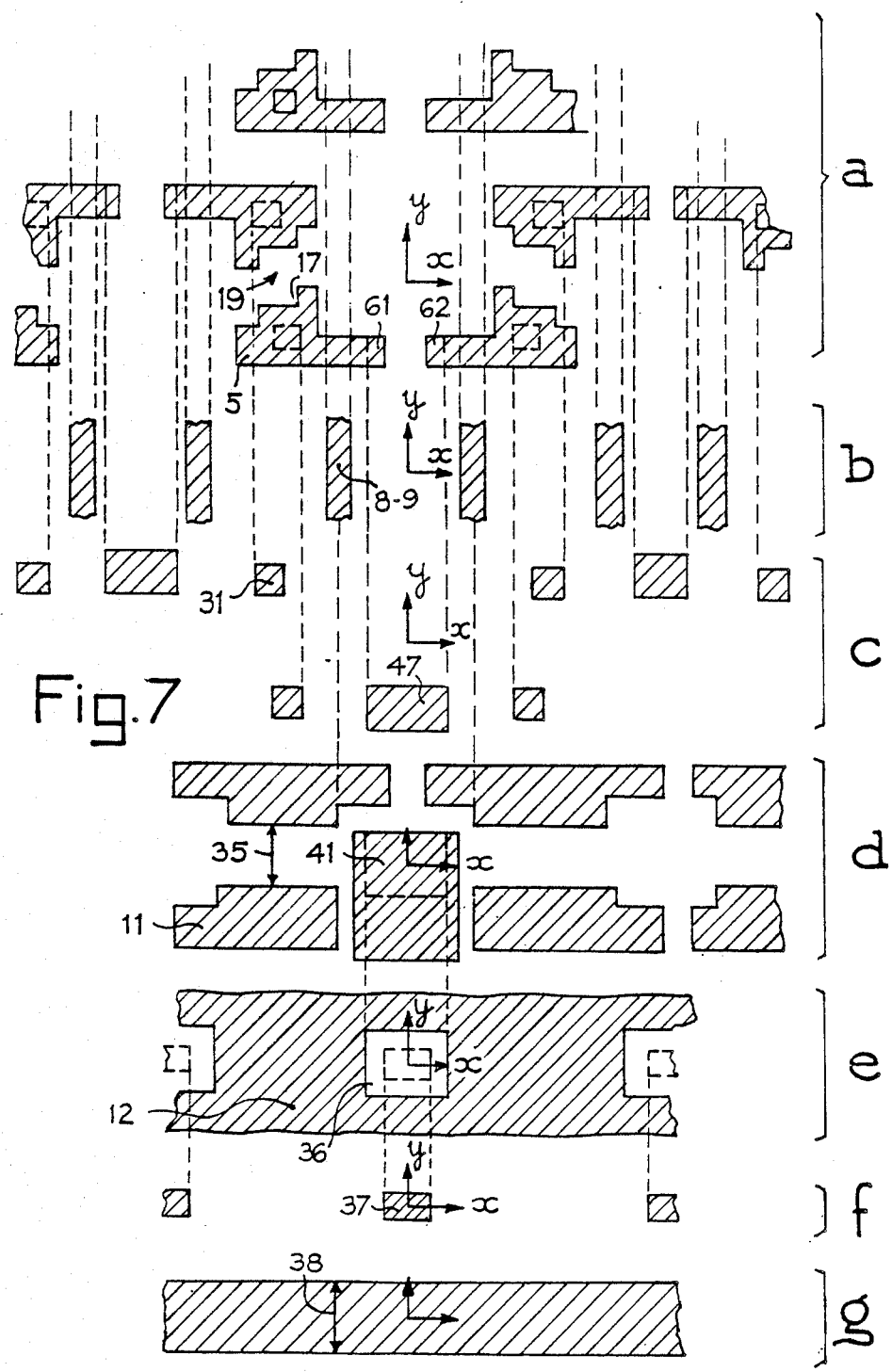
FIGS. 7a to 7g illustrate an alternative embodiment of the set of masks which offers improved performance.
Figure 8:
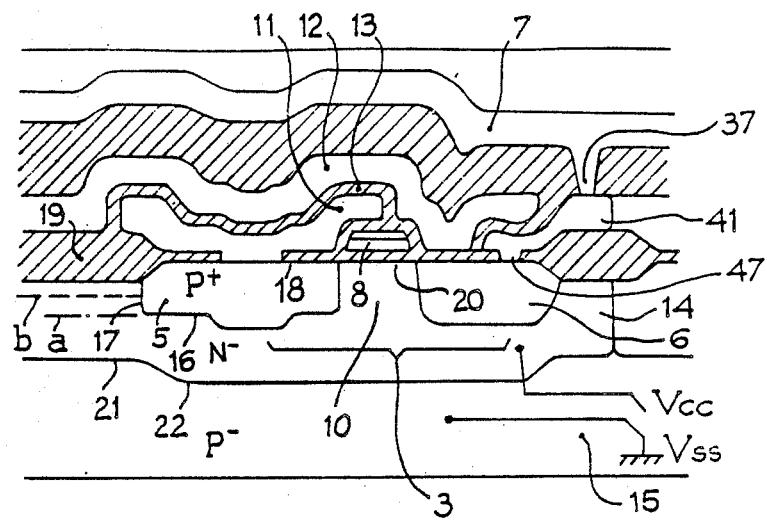
FIG. 8 is a sectional view of a memory cell which has been modified in accordance with the alternative embodiment aforesaid.

The sixth mask of FIG. 6c is intended to form the openings 31 which will serve to connect the conventional capacitors of the memory cells. In the alternative embodiment (shown in FIG. 7c), openings 47 are formed in addition for connecting the drain end portions 61 and 62. The openings 47 can be formed in a single operation for two adjacent end-portions to be connected together. It will be apparent in this case that the central portion of the opening 47 does not pass through the thick oxide 19. Dashed lines show that these openings are located above the regions 5 in FIG. 6a and also astride the drain regions in FIG. 7a. The seventh mask of FIG. 6d serves to form the lower plate 11 of the conventional memory cell capacitor. In the present invention, separations 34 or 35 are formed between adjacent memory cells, thereby guarding against any danger of short-circuits. Attention is drawn, however, to a distinctive feature of the invention in which the layer 11 covers the gate space of the transistor at least to a partial extent and occupies the surface as effectively as possible. The contour of the layer 41 (to be formed at the same time as the layer 11) as shown in FIG. 7d is intended to be superposed on the opening 47 in the bottom portion thereof and to be located in the line of extension of the space 35 in the top portion thereof. The eighth mask of FIGS. 6e and 7e illustrates the design of the polysilicon layer 12 of the third level. This layer extends over the entire memory plane and above an entire memory cell except in a region 36 which will make it possible to form the drain contact 37 (as shown in FIGS. 2, 7f and 8). The ninth mask of FIGS. 6f and 7f makes it possible to open the drain contact. The tenth mask of FIGS. 6g and 7g defines the connecting lead 7 of the transfer line.

It is of interest to note that the width 38 of the pattern of the tenth mask is exactly inscribed within the space 35 formed in the seventh mask (as shown in FIGS. 6d and 7d). This arrangement makes it possible to limit excessive stacking of layers. Thus the aluminum contact which extends downwards from the transfer line 7 to the opening 37 is of small depth. In the alternative embodiment, said contact even has a stairstep configuration by reason of the relative displacement produced by the layer 41. This distinctive type of superposition associated with metallization of the word lines of tungsten silicides, with juxtaposition of the memory cells which have a common drain and with formation of the conventional two-level polysilicon capacitor which covers the transistor gate at least to a partial extent has the effect of endowing the memory cell with a degree of compactness such that integration of a large number of cells on a single wafer is appreciably facilitated. The use of a metallic bit line and the minimization of the capacitance of said bit line also improve the performances of the memory.

In fact, should the bit line not be metallic, it would accordingly be necessary to form bit lines of the diffused type. This would tend to prevent interpenetration of the patterns of FIG. 6a or 7a. Furthermore, should the word line not be metallized, the access times would consequently be adversely affected unless superposed metallic word lines are formed at the top of the memory. This would constitute an additional layer. The addition of this layer would be hazardous and the space required for forming the connections between these superposed lines and the silicon gates would in that case be so substantial as to make it necessary in the final analysis to construct a memory cell of larger size.

What is claimed is:

1. A dynamic memory of the integrated circuit type fabricated in a silicon wafer and provided with memory cells for capacitive data storage, wherein said dynamic memory comprises:
   CMOS transistors fabricated in the CMOS technology for utilization as memory cells and provided with gate electrodes formed by a first level of deposited polysilicon and covered by a metallized layer to be utilized as a word line for the memory;

means for capacitive storage by putting in opposition to each other, at a second and a third levels, two polysilicon layers, said second and third polysilicon layers being separated from each other and from the first level by insulating layers of silicon dioxide;

regions of said second level polysilicon layer serving to form lower plate of capacitors of said cells, said regions of said second level polysilicon layer being separated by separations;

data transfer lines formed of vacuum-deposited metal;

the polysilicon layers of the second and third levels being formed so as to pass over the polysilicon layer of the first level wherein the transfer lines are superimposed over said separations but are not extended over said regions of said level polysilicon layer.

2. A memory according to claim 1, wherein the transfer lines comprise contact connections providing access to the transistor of a memory cell and wherein the polysilicon layer of the third level covers the entire wafer except for the regions of said wafer in which said contact connections are placed.

3. A memory according to claim 2, wherein the contact connections related to two memory cells for which the word lines are adjacent are combined in a single contact connection.

4. A memory according to claim 1, wherein the metallization of the polysilicon layer of the first level comprises a layer of tungsten polysilicides.

5. A memory according to claim 1, wherein the metal of the transfer lines in aluminum.

6. A memory according to claim 1, wherein the polysilicon layer of the second level is doped after deposition with the same impurities as those which have served to dope the drain and source regions of the transistors.

7. A memory according to claim 1, wherein said transistor with its drain implanted in a well in the perimeter of the drain regions is reduced in order to reduce the junction capacitance between said drain regions and a well in which said drains are implanted.

8. A dynamic energy of the integrated circuit type fabricated in a silicon wafer and provided with memory cells for capacitive data storage, wherein said dynamic memory comprises:

CMOS transistors fabricated in the CMOS technology for utilization as memory cells and provided with gate electrodes formed by a first level of deposited polysilicon and covered by a metallized layer to be utilized as a word line for the memory;

means for capacitive storage by putting in opposition to each other, at a second and a third levels, two polysilicon layers, said second and third level polysilicon layers being separated from each other and from the first level by insulating layers of silicon oxide;

regions of said second level polysilicon layer serving to form lower plates of capacitors of said cells, said regions of said second level polysilicon layer being separated by separations;

data transfer lines formed of vacuum-deposited metal;

the polysilicon layers of the second and third levels being formed so as to pass over the polysilicon layer of the first level wherein the transfer lines are superimposed over said separations ; and connections in the form of a stairstep configuration for connecting said data transfer lines and the drain regions of said CMOS transistors said connection extending perpendicularly to said transfer lines.

* * * * *